United States Patent
Zhang et al.

(10) Patent No.: US 7,446,026 B2
(45) Date of Patent: Nov. 4, 2008

(54) METHOD OF FORMING A CMOS DEVICE WITH STRESSOR SOURCE/DRAIN REGIONS

(75) Inventors: Da Zhang, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 269 days.

(21) Appl. No.: 11/349,595

(22) Filed: Feb. 8, 2006

(65) Prior Publication Data

US 2007/0184601 A1 Aug. 9, 2007

(51) Int. Cl.
*H01L 21/3205* (2006.01)
*H01L 21/4763* (2006.01)
*H01L 21/8238* (2006.01)
*H01L 21/8234* (2006.01)

(52) U.S. Cl. .................. 438/592; 438/199; 438/275; 257/E21.198

(58) Field of Classification Search ............... 438/199, 438/592
See application file for complete search history.

(56) References Cited

U.S. PATENT DOCUMENTS

| | | | |
|---|---|---|---|
| 6,383,879 B1 | 5/2002 | Kizilyalli et al. | |
| 6,448,180 B2 * | 9/2002 | Mani et al. | 438/680 |
| 6,518,106 B2 | 2/2003 | Ngai et al. | |
| 6,531,347 B1 * | 3/2003 | Huster et al. | 438/164 |
| 6,599,785 B2 * | 7/2003 | Hamada et al. | 438/151 |
| 6,642,132 B2 * | 11/2003 | Cho et al. | 438/592 |
| 2004/0180487 A1 * | 9/2004 | Eppich et al. | 438/199 |
| 2004/0262694 A1 * | 12/2004 | Chidambaram | 257/369 |
| 2005/0280098 A1 * | 12/2005 | Shin et al. | 257/371 |
| 2006/0054968 A1 * | 3/2006 | Lee | 257/327 |
| 2007/0138570 A1 * | 6/2007 | Chong et al. | 257/371 |

OTHER PUBLICATIONS

Ghani, T. et al.; "A 90nm High Volume Manufacturing Logic Technology Featuring Novel 45nm Gate Length Strained Silicon CMOS Transistors"; IEDM Technical Digest; 2003; p. 978; USA.
PCT/US07/60145 International Search Report and Written Opinion mailed Aug. 26, 2008.

* cited by examiner

*Primary Examiner*—Zandra V. Smith
*Assistant Examiner*—Daniel Luke
(74) *Attorney, Agent, or Firm*—Robert L. King; Joanna G. Chiu (57) ABSTRACT

A method for forming a semiconductor device includes providing a semiconductor substrate having a first doped region and a second doped region, providing a dielectric over the first doped region and the second doped region, and forming a first gate stack over the dielectric over at least a portion of the first doped region. The first gate stack includes a metal portion over the dielectric, a first in situ doped semiconductor portion over the metal portion, and a first blocking cap over the in situ doped semiconductor portion. The method further includes performing implantations to form source/drain regions adjacent the first and second gate stack, where the first blocking cap has a thickness sufficient to substantially block implant dopants from entering the first in situ doped semiconductor portion. Source/drain embedded stressors are also formed.

8 Claims, 6 Drawing Sheets

METHOD OF FORMING A CMOS DEVICE WITH STRESSOR SOURCE/DRAIN REGIONS

FIELD OF THE INVENTION

This invention relates generally to semiconductor devices, and more specifically, to methods of manufacture of semiconductor devices.

BACKGROUND OF THE INVENTION

Transistor structures have been proposed for modifying the amount of stress existing in a channel region. A known problem in the art is the depletion of dopants in a polysilicon gate electrode at the end to the channel. When an adequate thermal budget does not exist, the amount of activated doping concentration adjacent the channel does not suffice. Further, gate doping typically occurs prior to the formation of source and drain electrodes by implantation. Subsequent multiple implant steps and anneals are required to complete formation of the transistor. This further processing negatively affects and modifies the electrical properties of polysilicon gates and adversely alters the transistor's performance and reliability. In conventional transistor fabrication with a source/drain stressor, multiple material etching/deposition steps take place which negatively impact the polysilicon gate integrity.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
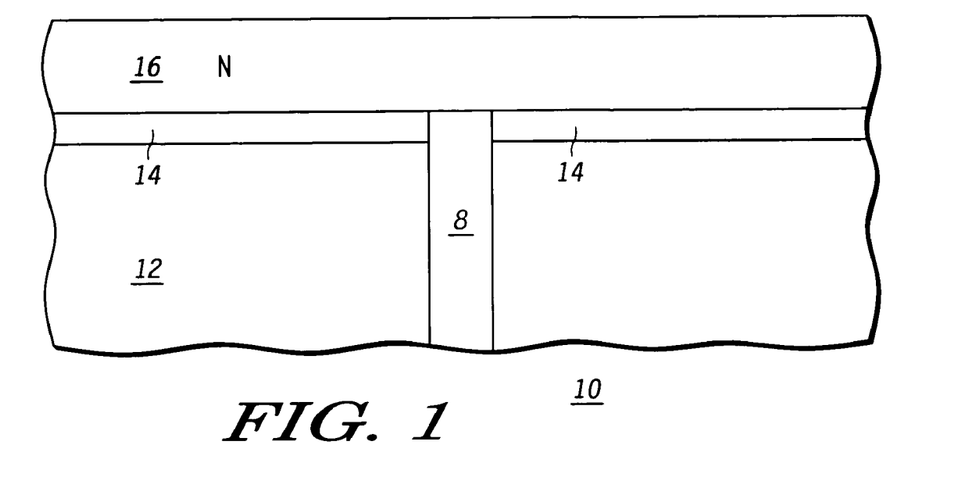
FIGS. 1-7 illustrate in cross-sectional form a method of forming a semiconductor structure in accordance with one embodiment of the present invention.

Illustrated in FIG. 1 is a semiconductor device 10 having a substrate 12 that is separated by a trench or an isolation region 8. In one form the substrate 12 is a bulk layer of silicon. In another form, the substrate 12 is a layer of silicon that is supported by an insulator (not shown) to form a device commonly referred to as a silicon on insulator (SOI) device. In other forms the substrate 12 is formed of other materials than silicon. For example substrate 12 may be silicon germanium, germanium or other semiconductor materials. Overlying the substrate 12 is a gate dielectric 14. The gate dielectric is also separated by the isolation region 8. In one form the gate dielectric 14 is silicon dioxide. However it should be understood that gate dielectric 14 may be implemented with any of various insulating materials. Overlying the gate dielectric 14 is an N type metal gate layer 16. The N type metal gate layer 16 in one form is tantalum silicon nitride but may be other types of conductive metals. Additionally, the metal gate layer 16 has an N-type conductivity and work function.

Figure 2:
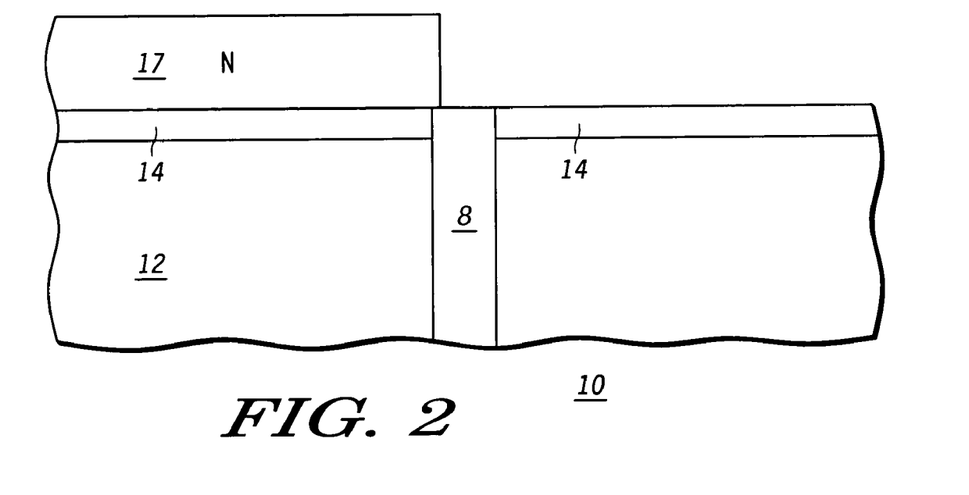

Illustrated in FIG. 2 is further processing of semiconductor device 10. In the illustrated form a patterned N-type metal gate layer 17 is provided overlying a portion of the substrate 12. It should be understood that the portion of substrate 12 that the patterned N-type metal gate layer 17 is formed over will be an area where it is desired to subsequently form an N-channel NMOS (N-channel Metal Oxide Semiconductor) transistor.

Figure 3:
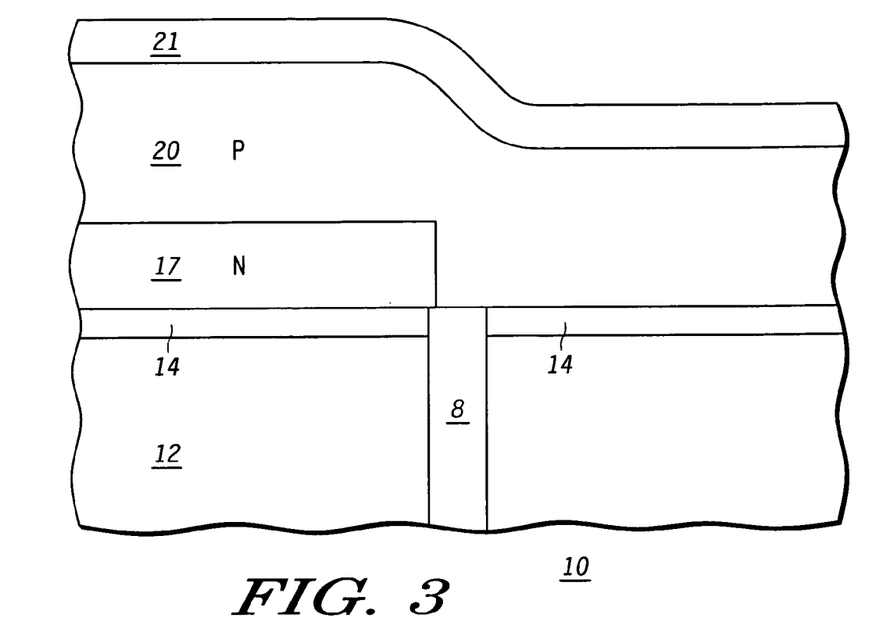

Illustrated in FIG. 3 is further processing of semiconductor device 10. A P-type gate electrode layer 20 is blanket deposited overlying the semiconductor device 10. In one form the P-type gate electrode layer 20 is formed of polysilicon or amorphous silicon or silicon germanium that has been in situ doped with P-type conductivity material. One form of the P-type dopant is boron, B. Overlying the P-type gate electrode layer 20 is formed a blocking cap layer 21. The blocking cap layer 21 may be a deposited layer of oxide, oxynitride or nitride or the combination of such layers. The function of blocking cap layer 21 is to prevent the subsequent penetration of an undesired dopant into the underlying gate electrode.

Figure 4:
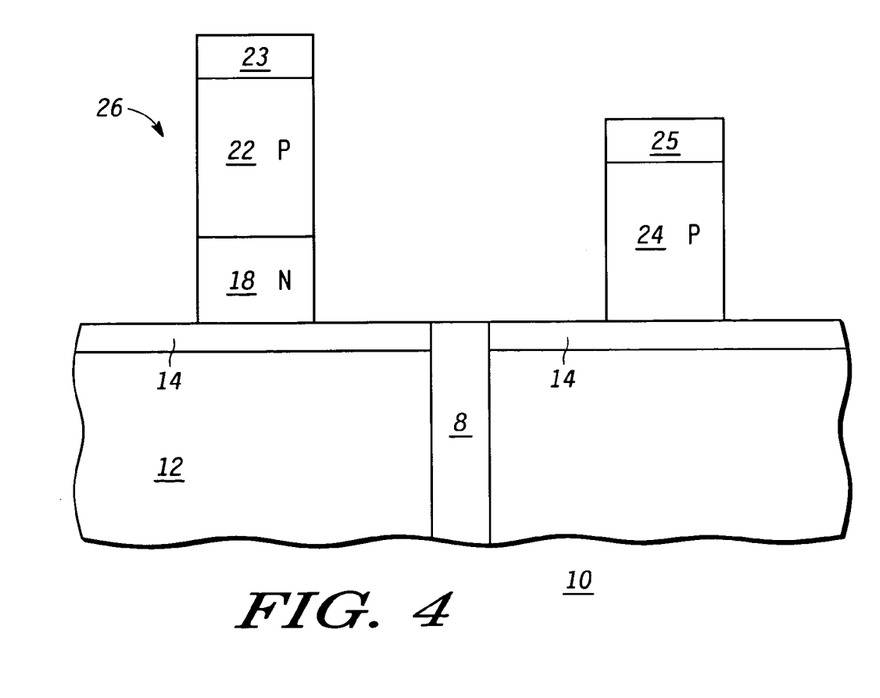

Illustrated in FIG. 4 is further processing of semiconductor device 10. The blocking cap layer 21, the P-type gate electrode layer 20 and the patterned N-type metal gate layer 17 are patterned with a masking layer (not shown) and etched. In one form a conventional anisotropic dry etch is performed, and the dry etch may be coupled with a wet etch process. The etch has a good selectivity to the gate dielectric 14 and forms an N-type gate electrode 26. A portion of the top surface of gate dielectric 14 is exposed. The N-type gate electrode 26 has three distinct sections which are the N-type metal gate portion 18, an upper gate portion 22 formed from the P-type gate electrode layer 20, and a blocking cap 23. Isolated from the N-type gate electrode 26 via the isolation region 8 is a gate structure for a P-channel transistor which is the right-most transistor in the figures. The P-channel transistor has a gate structure formed of a P-type gate electrode 24 with an overlying blocking cap 25.

Figure 5:
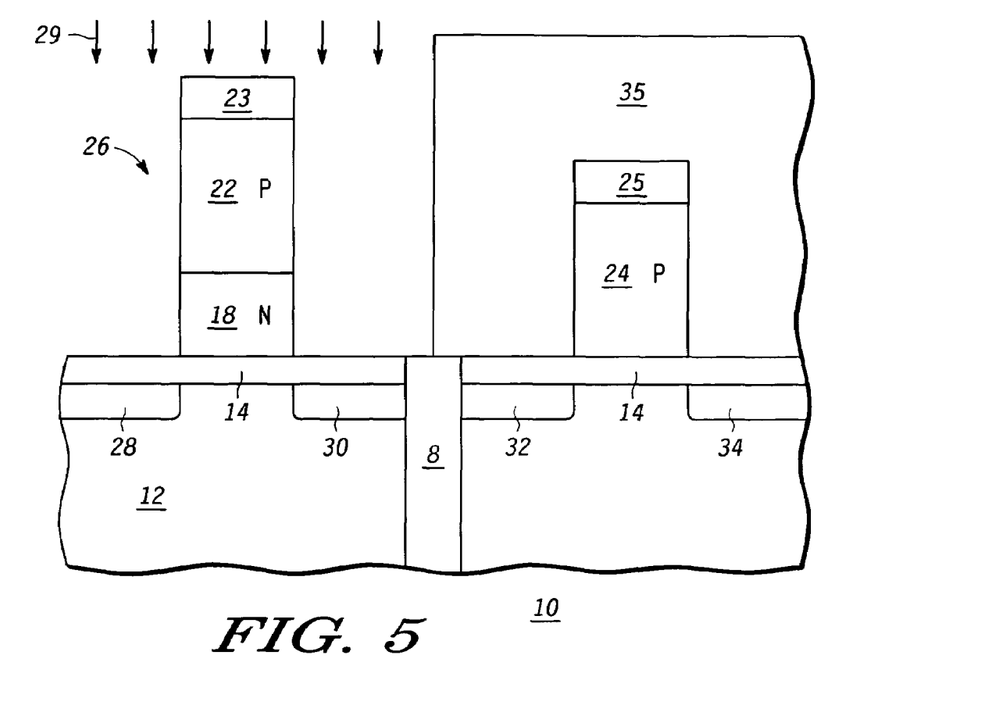

Illustrated in FIG. 5 is further processing of semiconductor device 10 wherein an N-type diffusion 29 is performed while the P-channel transistor is protected by a pattern masking layer 35. Prior to the implanting of the N-channel transistor, the P-channel transistor has been previously doped with the N-channel transistor being masked. The implanting of the P-channel transistor results in the formation of source/drain extensions 32 and 34 of P-type conductivity within substrate 12. After formation of source/drain extensions 32 and 34, source/drain extensions are formed for the N-channel transistor. In one form an N-type diffusion 29 is performed by diffusing an N-conductivity arsenic dopant. As a result, source/drain extensions 28 and 30 are formed within substrate 12. It should be noted that blocking cap 23 and blocking cap 25 perform critical functions. In particular, each of block cap 23 and blocking cap 25 prevent the penetration of implant ions into the underlying gate material. This blocking prevents the counter doping of an N conductivity portion within the upper portion of the upper gate portion 22. Otherwise, the gate electrode resistance and contact resistance may increase which affects transistor performance and circuit speed. It should also be understood that the formation of the source/drain extensions 32, 34 and source/drain extensions 28, 30 may be reversed so that the N-channel transistor's source and drain extensions are formed prior to those of the P-channel transistor's source/drain extensions.

Figure 6:
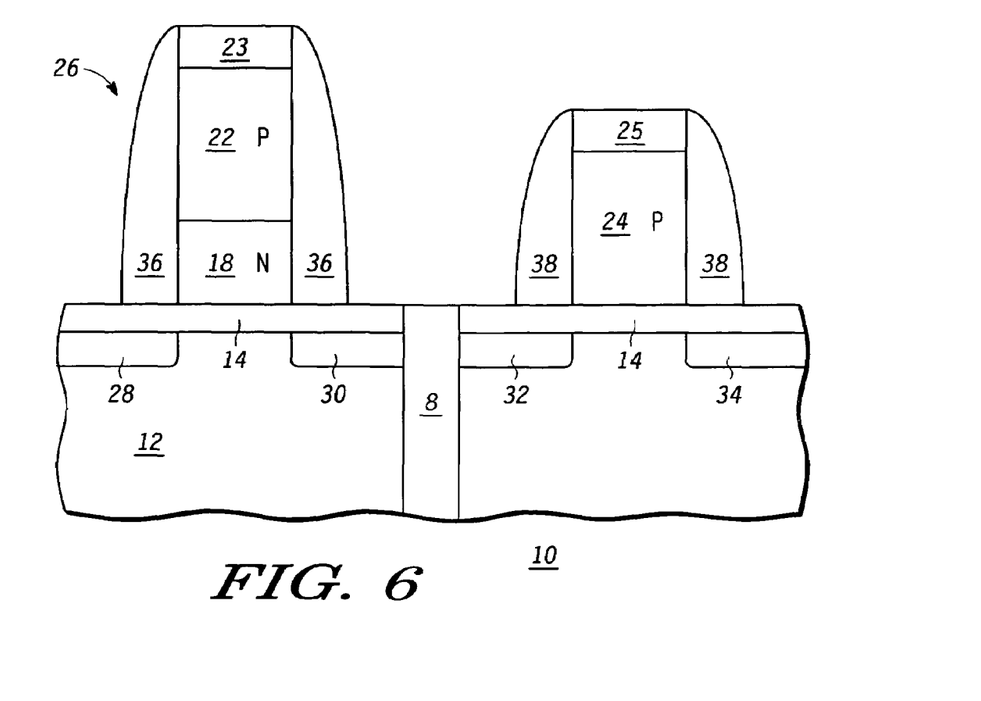

Illustrated in FIG. 6 is further processing of semiconductor device 10. In particular, the N-type gate electrode 26 is further processed to form a sidewall spacer 36 along the sidewalls thereof. The sidewall spacer 36, in one form, is formed of silicon nitride with a silicon oxide liner (not shown) at the interface with the blocking cap 23, the upper gate portion 22 and the metal gate portion 18. At the same time that sidewall spacer 36 is formed, a sidewall spacer 38 is also formed adjacent the gate structure of the P-channel transistor. In particular, sidewall spacer 38 is formed along the exposed sidewalls of the gate electrode 24 and the blocking cap 25.

Figure 7:
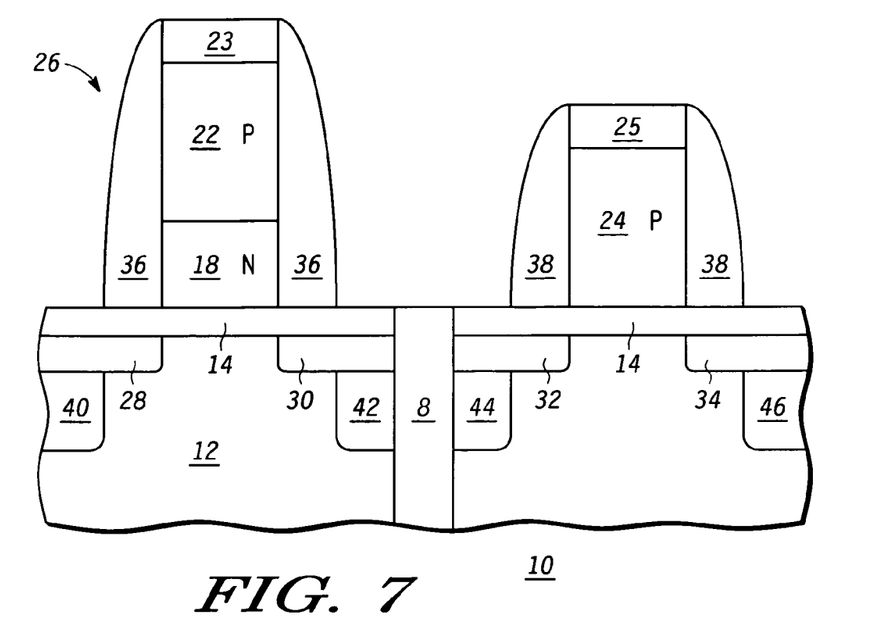

Illustrated in FIG. 7 is further processing of one form of semiconductor device 10 from FIG. 6. In particular, deep source/drain regions 40, 42, 44 and 46 are formed within each of the N-channel transistor and the P-channel transistor, respectively. The deep source/drain regions 40, 42, 44 and 46 may be formed by conventional ion implantation and activation. The deep source/drain regions 40 and 42 are N-type arsenic dopant and the deep source/drain regions 44 and 46 are P-type boron dopant. It should be understood that the deep source/drain regions 40 and 42 merge with the source/drain extensions 28 and 30, respectively, to form a continuous source or drain.

Figure 8:
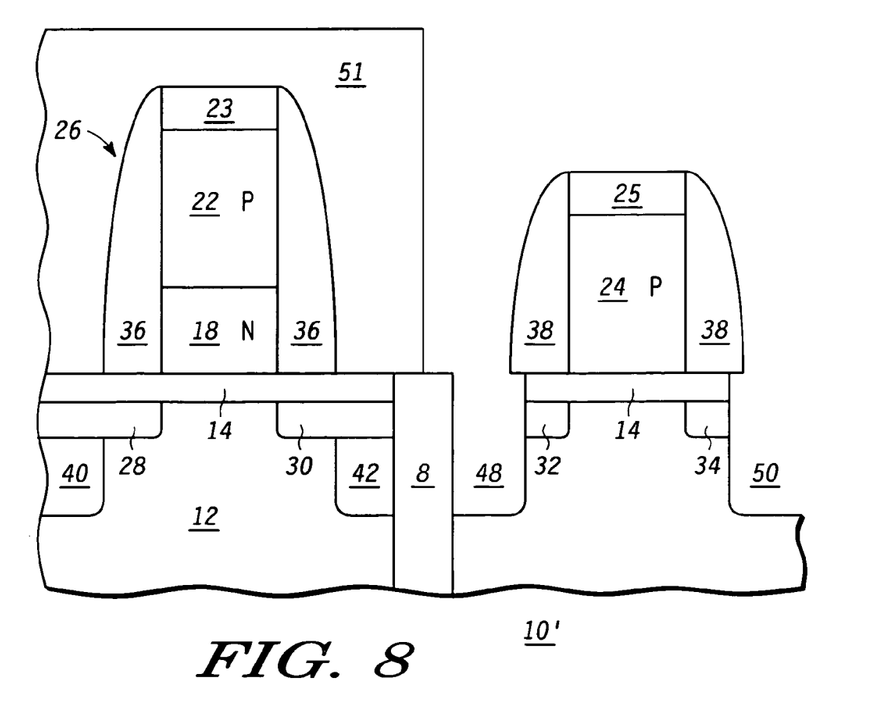
FIGS. 8 and 9 illustrate in cross-sectional form a method of forming a semiconductor structure in accordance with another embodiment of the present invention following the processing of FIGS. 1-6.

Illustrated in FIG. 8 is further processing of another form of semiconductor device 10 from FIG. 6. In particular, a semiconductor device 10' is formed by initially forming deep source/drain regions 40 and 42 for the N-channel transistor which is the left-most transistor in the figures. The deep source/drain regions 40 and 42 are formed in a conventional manner by performing an N-type arsenic dopant into substrate 12. The deep source/drain regions 40 and 42 merge with the source/drain extensions 28 and 30, respectively, to form a continuous source or drain. After formation of a source and a drain for the N-channel transistor, a patterned masking layer 51 is provided overlying the N-channel transistor while leaving the P-channel transistor exposed. With the patterned masking layer 51 in place, a conventional isotropic dry etch is performed to etch exposed portions of the gate dielectric 14 and underlying exposed portions of the source/drain extensions 32, 34 and deep source/drain regions 44 and 46. As a result, an opening 48 and an opening 50 are formed adjacent the gate structure of the P-channel transistor and within the substrate 12. To the left of the P-channel transistor the opening 48 extends to the isolation region 8. Opening 50 extends to the right of the gate structure of the P-channel transistor for a predetermined amount before ending at a point not illustrated.

Figure 9:
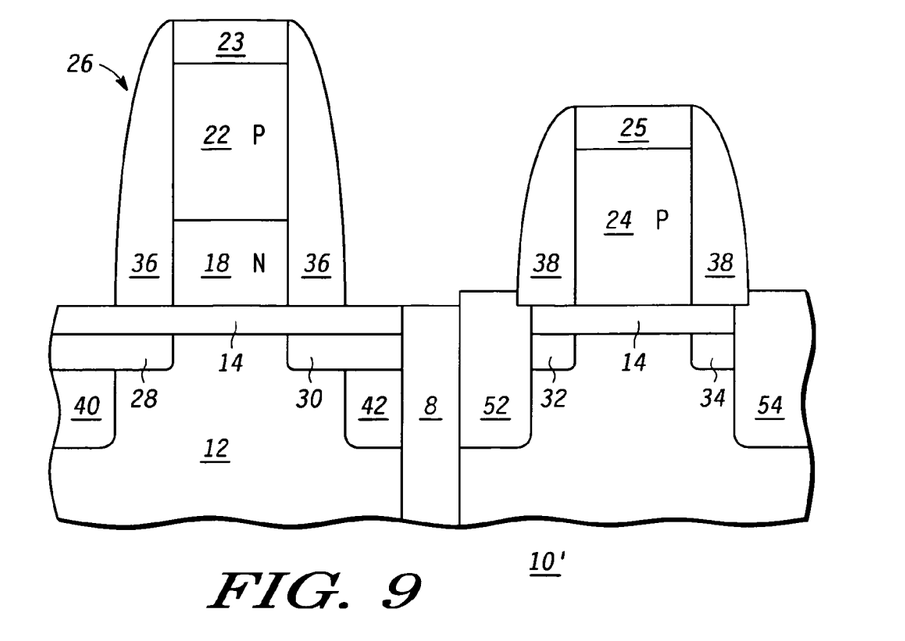

Illustrated in FIG. 9 is further processing of semiconductor device 10'. In particular, the opening 48 and the opening 50 are filled by epitaxial growth of a stressor material with the patterned masking layer 51 in place to form embedded stressor source/drain regions 52 and 54. The stressor source/drain regions 52 and 54 for a P-channel transistor device are formed of silicon germanium with in situ boron doping. Other stressor materials for P-channel transistors may be used with or with in situ boron doping. In another form the source/drain stressor regions may be formed as undoped silicon germanium regions and then doped via a conventional implant with the N-channel transistor being protected by a masking layer such as patterned masking layer 51.

Figure 10:
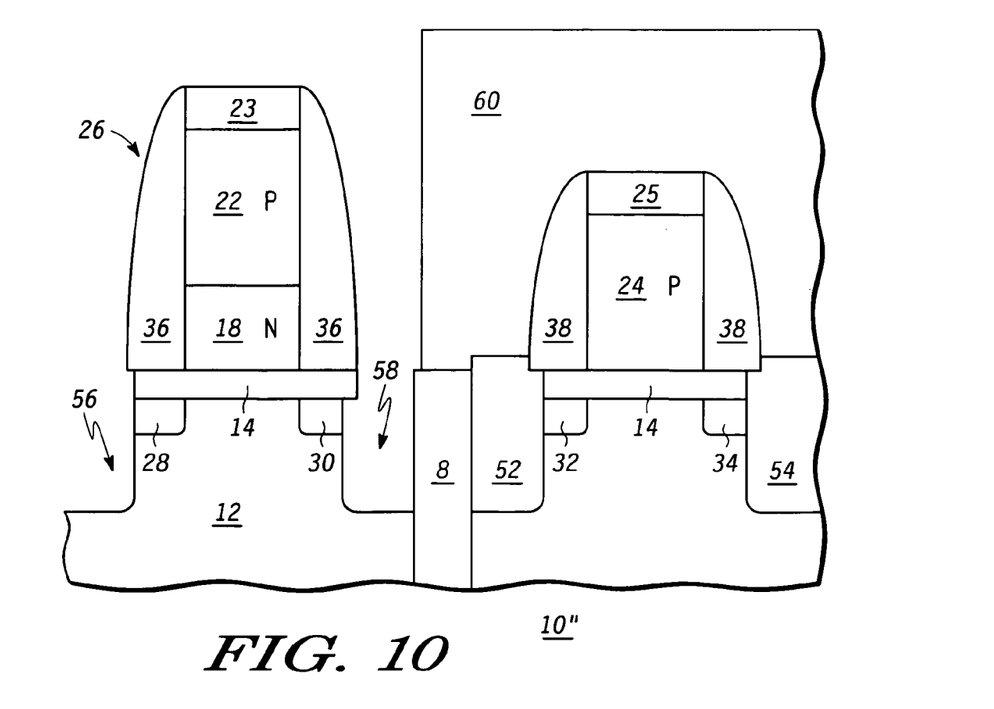
FIGS. 10-12 illustrate in cross-sectional form yet another method of forming a semiconductor structure in accordance with yet another embodiment of the present invention following the processing of FIGS. 1-6.

Illustrated in FIG. 10 is further processing of semiconductor device 10" following the processing illustrated in FIG. 6. A P-channel transistor having a P-type gate electrode 24 and blocking cap 25 is formed. In the illustrated form the P-channel transistor has a stressor material. It should be understood that in another form the P-channel transistor may be implemented without a stressor material. In the illustrated form of FIG. 10, the P-channel transistor is formed in a same manner as that previously described for the P-channel transistor of semiconductor device 10 and semiconductor device 10'.

For the formation of the N-channel transistor of FIG. 10, a patterned masking layer 60 is formed overlying the P-channel transistor. With the patterned masking layer 60 protecting the P-channel transistor, a conventional isotropic dry etch is performed on the N-channel transistor. The dry etch functions to remove exposed portions of the gate dielectric 14 and an underlying exposed portion of the source/drain extensions 28 and 30. The etch step further etches into a portion of the substrate 12 to create an opening 56 and an opening 58.

Figure 11:
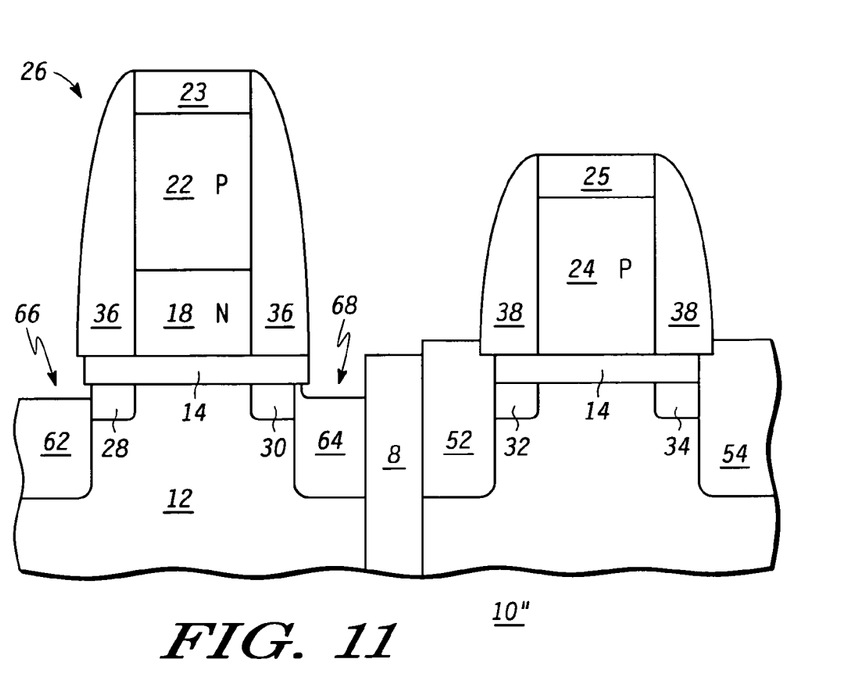

Illustrated in FIG. 11 is further processing of semiconductor device 10" of FIG. 10. In particular, each of the openings 56 and 58 are selectively filled with a semiconductive material such as in situ doped silicon carbide to form stressor source/drain regions 62 and 64. An N-type doping material, such as arsenic or phosphorous is introduced into a chamber (not shown) during epitaxial growth. During the formation of the stressor source/drain regions 62 and 64, the P-channel transistor is protected by a patterned masking layer 60 of FIG. 10. It should be noted that the height of the stressor source/drain regions 62 and 64 is made to be slightly below the level of the gate dielectric 14. The reason for the reduced height is related to the desired stress and to minimize the conventional Miller capacitance existing between the source/drain and the gate of the N-channel transistor. By having a lower height for the source/drain regions 62 and 64, an overlying silicide layer that is used for making electrical contact will have more effect on channel stress as will be described below. It should be noted that the stressor source/drain regions 52 and 54 for the P-channel transistor are slightly elevated above the gate dielectric 14 to reduce the impact of tensile stress of an overlying silicide that will be formed. FIG. 11 illustrates stressor source/drain regions 52 and 54 for the P-channel transistor in direct contact with a sidewall of the gate dielectric 14.

Figure 12:
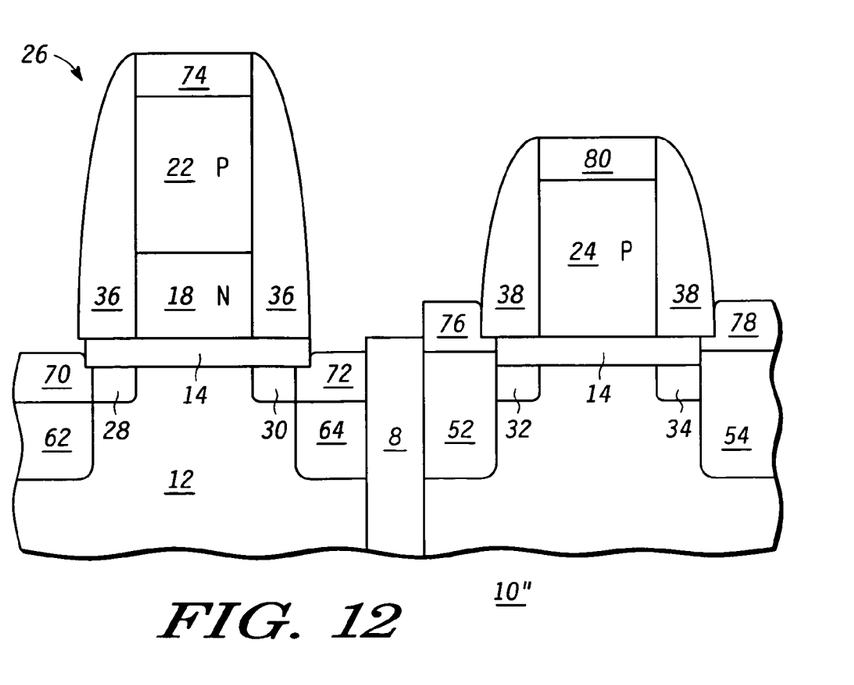

Illustrated in FIG. 12 is further processing of semiconductor device 10". The blocking cap 23 and blocking cap 25 are removed by either a wet etch or a dry etch. After removal of the blocking caps, silicide regions 70, 72, 76 and 78 are formed overlying stressor source/drain regions 62, 64, 52 and 54, respectively. Additionally, silicide regions 74 and 80 are formed overlying the upper gate portion 22 and the P-type gate electrode 24, respectively. The silicide regions 70, 72, 76 and 78 that are formed overlying stressor source/drain regions 62, 64, 52 and 54 inherently possess a tensile stress. This tensile stress has a lateral vector force that asserts stress on the adjoining channel regions for each of the N-channel transistor and the P-channel transistor. Tensile stress enhances N-channel transistor performance but degrades the transistor performance for P-channel devices. Conversely, compressive stress enhances the transistor performance for P-channel devices. As a result, the silicide regions 76 and 78 are formed largely above the channel region of the P-channel transistor and therefore the negative effect is minimized. Beneficial stress is provided for the P-channel transistor because the stressor source/drain regions 52 and 54 provide compressive stress on the channel region of the P-channel transistor.

For the N-channel transistor, the stressor source/drain regions 62 and 64 and silicide regions 70 and 72 each function to add tensile stress in the channel of the N-channel transistor. As a result, each of these regions functions collectively to beneficially modify the stress in the channel of the N-channel transistor.

By now it should be apparent that there has been provided a method for making a semiconductor device, such as a transistor, in which a protected in situ doped control electrode is formed with a channel having stressor regions for stress control of the channel. The gate is formed of two materials, one being a metal and the other being an in situ doped material to respectively provide N-channel and P-channel transistor gates with differing and desired work functions. The in situ doped material is protected by a capping layer so that any subsequent implants do not change the doping of the gate. Additionally, this gate structure overlies a channel that has stress accurately controlled in a manner that differentiates between N-channel and P-channel transistors. By using in situ doping of a portion of the gate electrode material, a conventional problem with known transistor structures having a low thermal budget for doping is overcome, wherein a thermal budget is the temperature and time for full doping activation. Particularly, such structures exhibit a gate electrode depletion issue wherein at the interface of the gate and channel there is a shortage of desired carriers. This problem is minimized by the use of in situ doped gate material for P-channel devices and the combination of in situ doped gate material and metal for N-channel devices.

In one form, there is provided a method for forming a semiconductor device by providing a semiconductor substrate having a first doped region. A dielectric is provided over the first doped region. A first gate stack is formed over the dielectric over at least a portion of the first doped region, the first gate stack having a metal portion over the dielectric, a first in situ doped semiconductor portion over the metal portion, and a first blocking cap over the in situ doped semiconductor portion. An implant is performed to form source/drain regions adjacent the first gate stack, wherein the first blocking cap has a thickness sufficient to substantially block dopants from the implant from entering the first in situ doped semiconductor portion. In one form, the semiconductor substrate includes a second doped region and the dielectric is formed over the first and second doped regions. A second gate stack is formed over the dielectric over at least a portion of the second doped region, the second gate stack having a second in situ doped semiconductor portion over the dielectric. In another form, stressor source/drain regions are formed adjacent the second gate stack, wherein the stressor source/drain regions provide stress to a channel region in the semiconductor substrate under the second gate stack. In another form, the stressor source/drain region are formed adjacent the second gate stack by forming openings adjacent the second gate stack. The openings are filled at least partially with silicon germanium in situ doped with boron. In another form, the first blocking cap is removed from the first gate stack and a silicide is formed at a top surface of the first in situ doped semiconductor portion. In another form, stressor source/drain regions are formed adjacent the first gate stack, wherein the stressor source/drain regions provide stress to a channel region in the semiconductor substrate under the first gate stack. In yet another form, the stressor source/drain regions are formed adjacent the first gate stack by forming openings adjacent the first gate stack and at least partially filling the openings with silicon carbide in situ doped with a dopant selected from a group consisting of phosphorous and arsenic.

In another form, there is provided a method for forming a semiconductor device. A semiconductor substrate having a first doped region and a second doped region is provided and a dielectric over the first doped region and the second doped region is provided. A metal layer is provided over the dielectric. The metal layer is patterned to leave a metal portion over at least a portion of the first doped region. An in situ doped semiconductor layer is formed over the metal portion and the second doped region. A blocking capping layer is formed over the in situ doped semiconductor layer. The blocking capping layer, the in situ doped semiconductor layer, and the metal portion are patterned. The patterning leaves a semiconductor gate over the second doped region and a metal/semiconductor gate stack over the first doped region having an in situ doped semiconductor portion and a blocking cap. An implant is performed to form deep source/drain regions adjacent the metal/semiconductor gate stack, wherein the blocking cap has a thickness sufficient to block dopants from the implant from entering the in situ doped semiconductor portion. In one form, openings are formed adjacent the semiconductor gate. The openings are at least partially filled to form stressor source/drain regions to provide stress to a channel region in the semiconductor substrate under the semiconductor gate. In one form, the openings are at least partially filled such that the stressor source/drain regions extend above a top surface of the semiconductor substrate. In another form, a silicide is formed at a top surface of each of the stressor source/drain regions, wherein the silicide is above the top surface of the semiconductor substrate. In another form, the openings are at least partially filled with silicon germanium in situ doped with boron to form stressor source/drain regions. In another form, openings are formed adjacent the metal/semiconductor gate stack and the openings are at least partially filled to form stressor source/drain regions to provide stress to a channel region in the semiconductor substrate under the metal/semiconductor gate stack. In another form, the openings are at least partially filled such that a top surface of each of the stressor source/drain regions lies below a top surface of the semiconductor substrate. In yet another form, a silicide is formed at a top surface of each of the stressor source/drain regions, wherein at least a portion of the silicide is below the top surface of the semiconductor substrate. In yet another form, the openings are at least partially filled with silicon carbide in situ doped with a dopant selected from group consisting of arsenic and phosphorous.

In another form, there is provided a method for forming a semiconductor device by providing a semiconductor substrate having a first doped region and a second doped region. A dielectric is provided over the first doped region and the second doped region. A first gate stack is formed over the dielectric over at least a portion of the first doped region, the first gate stack having a metal portion over the dielectric, and a first in situ doped semiconductor portion over the metal portion. A second gate stack is formed over the dielectric over at least a portion of the second doped region, the second gate stack having a second in situ doped semiconductor portion over the dielectric. First stressor source/drain regions are formed adjacent the first gate stack, wherein the first stressor source/drain regions provide stress to a first channel region in the semiconductor substrate under the first gate stack. Second stressor source/drain regions are formed adjacent the second gate stack, wherein the second stressor source/drain regions provide stress to a second channel region in the semiconductor substrate under the second gate stack. In one form, the first gate stack further includes a blocking cap over the first in situ doped semiconductor portion. The method further includes performing an implant to form deep source/drain regions adjacent the first gate stack, wherein the blocking cap has a thickness sufficient to substantially block dopants from the implant from entering the first in situ doped semiconductor portion. In another form, the blocking cap is removed from the first gate stack. A silicide is formed at a top surface of the first in situ doped semiconductor portion. Silicides are formed at top surfaces of each of the first and second stressor source/drain regions.

In the foregoing specification, the invention has been described with reference to specific embodiments. However, one of ordinary skill in the art appreciates that various modifications and changes can be made without departing from the scope of the present invention as set forth in the claims below. For example, depending upon the material selected for the substrate, a stressor material and dimensions of the stressor material regions will be modified to select a desired channel stress.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method for forming a semiconductor device comprising:
   providing a semiconductor substrate having a first doped region and a second doped region;
   providing a first gate dielectric over the first doped region and providing a second gate dielectric over the second doped region, both the first doped region and the second doped region being electrically isolated by an isolation region that also separates the first gate dielectric and the second gate dielectric;
   forming a first gate stack for an N-channel transistor over the first gate dielectric over the first doped region, the first gate stack having a metal portion over and in contact with the first gate dielectric, a first in situ doped semiconductor portion over and in contact with the metal portion, and a first blocking cap comprising a material for preventing counter doping and over the first in situ doped semiconductor portion;
   forming a second gate stack for a P-channel transistor over the second gate dielectric over the second doped region, the second gate stack having a second in situ doped semiconductor portion over and in contact with the second gate dielectric, and a second blocking cap over and in contact with the second in situ doped semiconductor portion and comprising the material for preventing counter doping;
   separately performing implants to form source/drain regions adjacent the first gate stack to form the N-channel transistor and to form source/drain regions adjacent the second gate stack as the P-channel transistor, wherein the first and second blocking caps each have a thickness sufficient to substantially block dopants from the implant from entering the first and second in situ doped semiconductor portions, respectively;
   forming first stressor source/drain regions adjacent the first gate stack and having an upper surface that is below a lower surface of the first gate dielectric; and
   forming second stressor source/drain regions adjacent the second gate stack and in direct contact with a portion of a sidewall of the second gate dielectric.

2. The method of claim 1, the method further comprising:
   forming a silicide layer overlying the second stressor source/drain regions and elevated above the second gate dielectric, wherein tensile stress to a channel of the P-channel transistor is reduced from the second stressor source/drain regions being elevated.

3. The method of claim 2 wherein the first blocking cap and the second blocking cap further comprise at least one of oxide, oxynitride or nitride and no metal.

4. A method for forming a semiconductor device comprising:
   providing a semiconductor substrate having a first doped region and a second doped region;
   providing a dielectric over the first doped region and the second doped region;
   providing a metal layer over the dielectric;
   patterning the metal layer to leave a metal portion over at least a portion of the first doped region and removing the metal layer from over the second doped region to expose the dielectric;
   forming an in situ doped semiconductor layer directly on the metal portion overlying the first doped region and directly on the dielectric overlying the second doped region;
   forming a blocking capping layer over the in situ doped semiconductor layer;
   patterning the blocking capping layer, in situ doped semiconductor layer, and the metal portion to leave a semiconductor gate of a P-channel transistor over the second doped region and a metal/semiconductor gate stack of an N-channel transistor over the first doped region having an in situ doped semiconductor portion and a blocking cap, the semiconductor gate of the P-channel transistor comprising the in situ doped semiconductor layer directly on the dielectric and the metal/semiconductor gate stack of the N-channel transistor comprising metal directly on the dielectric;
   performing an implant to form deep source/drain regions adjacent the metal/semiconductor gate stack to form the N-channel transistor, wherein the blocking cap has a thickness sufficient to block dopants from the implant from entering the in situ doped semiconductor portion;
   performing an implant to form deep source/drain regions adjacent the semiconductor gate to form the P-channel transistor, wherein the blocking cap has a thickness sufficient to block dopants from the implant from entering the in situ doped semiconductor portion;
   forming first stressor source/drain regions adjacent the metal/semiconductor gate stack and having an upper surface that is below a lower surface of the dielectric; and
   forming second stressor source/drain regions adjacent the semiconductor gate and extending above the second gate dielectric to reduce stress.

5. The method of claim 4, further comprising:
   forming a silicide layer overlying the second stressor source/drain regions and elevated above the dielectric, wherein tensile stress to a channel of the P-channel transistor is reduced from the second stressor source/drain regions being elevated.

6. A method for forming a semiconductor device comprising:

providing a semiconductor substrate having a first doped region and a second doped region;

providing a dielectric over the first doped region and the second doped region;

forming a first gate stack for an N-channel transistor over the dielectric over the first doped region, the first gate stack having a metal portion directly on the dielectric, and a first in situ doped semiconductor portion directly on the metal portion;

forming a second gate stack for a P-channel transistor over the dielectric over the second doped region, the second gate stack having a second in situ doped semiconductor portion directly on the dielectric;

forming first stressor source/drain regions within the semiconductor substrate adjacent the first gate stack and below a lower surface of the dielectric, wherein the first stressor source/drain regions provide stress to a first channel region in the semiconductor substrate under the first gate stack; and forming second stressor source/drain regions adjacent the second gate stack and in direct contact with a sidewall of the dielectric, wherein the second stressor source/drain regions provide stress to a second channel region in the semiconductor substrate under the second gate stack.

7. The method of claim 6 further comprising:

forming silicides at top surfaces of each of the first stressor source/drain regions and the second stressor source/drain regions and laterally adjacent the dielectric, wherein at least a portion of the silicides do not extend along an entire height of sidewalls of the dielectric of the P-channel transistor.

8. The method of claim 6, further comprising:

forming silicides at top surfaces of each of the first stressor source/drain regions and the second stressor source/drain regions, wherein the silicides at the top surfaces of the first stressor source/drain regions have an upper surface that do not extend higher than the dielectric and the silicides at the top surfaces of the second stressor source/drain regions have an upper surface that do extend higher than the dielectric.

* * * * *